United States Patent [19]
Drimer

[11] Patent Number: 6,157,003
[45] Date of Patent: Dec. 5, 2000

[54] FURNACE FOR PROCESSING SEMICONDUCTOR WAFERS

[75] Inventor: Gideon Drimer, Jerusalem, Israel

[73] Assignee: Persys Technology, Ltd., Jerusalem, Israel

[21] Appl. No.: 09/179,198

[22] Filed: Oct. 27, 1998

[30] Foreign Application Priority Data

Aug. 6, 1998 [IL] Israel ........................................ 125690

[51] Int. Cl.$^7$ ........................................................ F27B 5/14
[52] U.S. Cl. ........................ 219/390; 118/725; 427/557; 392/416
[58] Field of Search .................................... 118/728, 725, 118/50.1; 392/416, 418; 219/390; 427/557; 438/795

[56] References Cited

U.S. PATENT DOCUMENTS

| | | | |
|---|---|---|---|
| 2,885,997 | 5/1959 | Schwindt | 118/730 |
| 3,659,552 | 5/1972 | Briody | 118/725 |
| 4,422,407 | 12/1983 | Bessot et al. | 118/723 E |
| 4,615,294 | 10/1986 | Scapple et al. | 118/50.1 |
| 4,823,736 | 4/1989 | Post et al. . | |
| 5,315,092 | 5/1994 | Takahashi et al. | 219/497 |
| 5,445,973 | 8/1995 | Hedstrom | 437/5 |
| 5,710,407 | 1/1998 | Moore et al. . | |
| 5,855,970 | 1/1999 | Inushima et al. | 427/579 |

*Primary Examiner*—Teresa Walberg
*Assistant Examiner*—Shawntina Fuqua
*Attorney, Agent, or Firm*—Nixon & Vanderhye P.C.

[57] ABSTRACT

A furnace for processing semiconductor wafers including an insulating enclosure; a first heating apparatus disposed centrally with respect to the insulating enclosure; a frame operative to support a multiplicity of semiconductor wafers in a nearly vertical orientation in at least one right polyhedronal tier about and facing the first centrally disposed heating apparatus; a double-walled quartz enclosure for enclosing the wafers which is operative to enable the wafers to be processed in a predetermined controlled environment; and a second heating apparatus disposed between the quartz enclosure and the insulating enclosure arranged, together with the first heating apparatus, for substantially uniform heating of the wafers.

9 Claims, 3 Drawing Sheets

FURNACE FOR PROCESSING SEMICONDUCTOR WAFERS

FIELD OF THE INVENTION

The present invention relates to semiconductor fabrication and specifically to furnaces for processing semiconductor wafer.

BACKGROUND OF THE INVENTION

There are presently two primary classes of devices for semiconductor wafer processing: batch furnaces and rapid thermal processors (RTP). Batch furnaces process large numbers of wafer at a time, but throughput can still be limited by long temperature ramp up and cool down times which can also reduce processing precision because of their large thermal budget. Newer, fast ramp batch furnaces provided limited improvement. Batch furnaces are also very expensive both in terms of running costs and clean room footprint. Rapid thermal processors (RTP) are fast and have a more advantageous thermal budget, but can only process a single wafer at a time.

SUMMARY OF THE INVENTION

The present invention seeks to provide a furnace and method for processing semiconductor wafers that provide the known advantages of faster temperature ramp up and cool down, reduced thermal budget, greater processing precision, and lower cost associated rapid thermal processing (RTP), while providing greater throughput by processing many wafers at a time as in batch furnace processing.

There is thus provided, in accordance with a preferred embodiment of the invention, a furnace for processing semiconductor wafers including:

an insulating enclosure;

first heating apparatus disposed centrally with respect to the insulating enclosure;

a frame operative to support a multiplicity of semiconductor wafers in a nearly vertical orientation in at least one right polyhedronal tier about and facing the first centrally disposed heating apparatus;

a double-walled quartz enclosure for enclosing the wafers which is operative to enable the wafers to be processed in a predetermined controlled environment;

second heating apparatus disposed between the quartz enclosure and the insulating enclosure arranged, together with the first heating apparatus, for substantially uniform heating of the wafers.

Further in accordance with a preferred embodiment of the present invention, the first heating apparatus may be either a tungsten-halogen heating lamp or an array of tungsten-halogen heating lamps and the second heating apparatus may be either one or more arrays of tungsten-halogen heating lamps or one or more electrical heating devices. These heating apparatus can further be divided into a number of heating zones of different heating levels.

There is also provided, in accordance with a further preferred embodiment of the invention, a method of processing semiconductor wafers in a furnace including the steps of:

arranging semiconductor wafers with a nearly vertical orientation in at least one polyhedronal tier about the center of the furnace;

heating the wafers from both sides simultaneously.

In accordance with a further embodiment of the present invention, the step of heating includes the step of heating different pluralities of semiconductor wafers to different predetermined temperatures and the step of arranging includes the step of arranging different pluralities of semiconductor wafers in different predetermined vertical zones, and the step of heating different pluralities includes heating different pluralities of semiconductor wafers in different vertical zones to different predetermined temperatures.

BRIEF DESCRIPTION OF THE DRAWINGS

The present invention will be more fully understood and appreciated from the following detailed description taken in conjunction with the drawings, in which.

DETAILED DESCRIPTION OF THE INVENTION

Figure 1A:
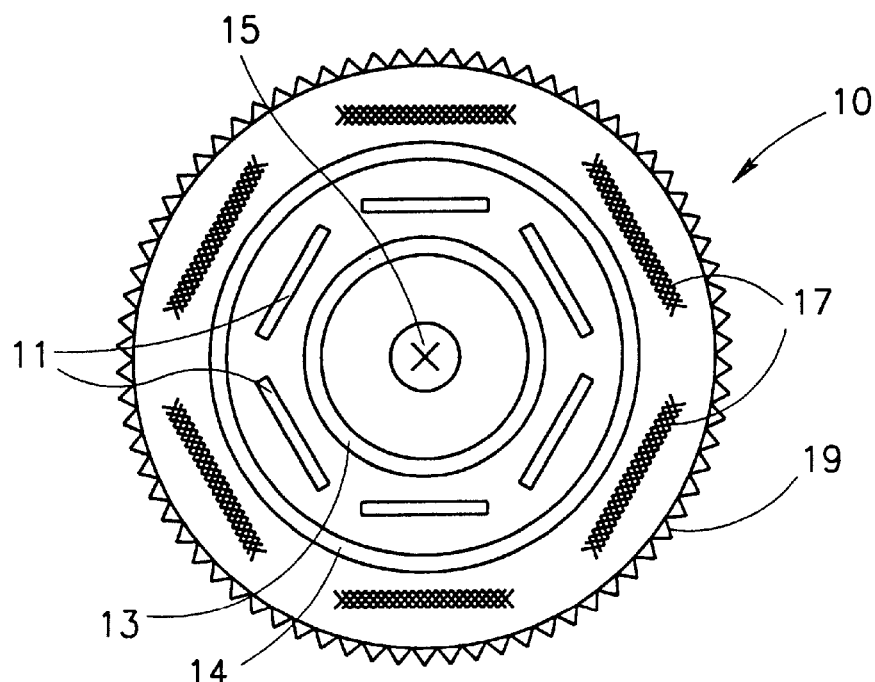
FIG. 1A is a schematic cutaway top view of a furnace for processing semiconductor wafers constructed and operative in accordance with a preferred embodiment of the present invention.
Figure 1B:
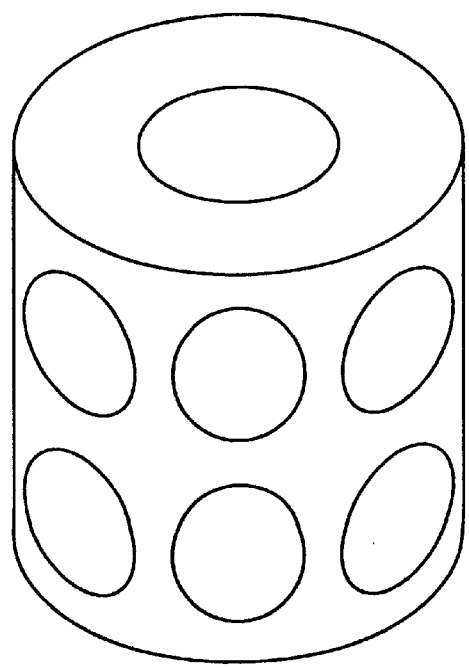
FIG. 1B a simplified perspective view of the quartz enclosure and the arrangement of the wafers of the furnace of FIG. 1A.

Referring now to FIGS. 1A and 1B, there is shown a simplified representation of a furnace for processing semiconductor wafers, referred to generally as 10, constructed and operative in accordance with a preferred embodiment of the present invention. FIG. 1A is a schematic cutaway top view of furnace 10, which includes an outer, insulating enclosure 19, within which are a number of heaters 17, which may be made up of electrical heating elements or of arrays of tungsten-halogen heating lamps; and a centrally located tungsten-halogen heating lamp heat source 15. The central heat source may be a single cylindrical tungsten-halogen heating lamp, as shown in the drawing, a number of such lamps, or a cylindrical array of smaller tungsten-halogen heating lamps. The semiconductor wafers 11 to be processed are disposed in a generally upright orientation, are distributed circumferentially about and are facing central heat source 15, and are enclosed within and without by quartz. In the present preferred embodiment, as shown in the drawing, there are six wafers 11 in a hexagonal arrangement; alternative embodiments may accommodate as few as three wafers or a larger number of wafers such as eight or more. In the present embodiment, as shown in the drawing, there is one heater 17 for each wafer 11, located on the outer side thereof with respect to central heat source 15 and oriented generally parallel thereto. Outer heaters 17 may be flat as shown in the drawing or, in an alternative preferred embodiment of the present invention, may be rounded. In a further alternative embodiment of the present invention, a single, cylindrical outer heating unit takes the place of outer heaters 17. Wafers 11 are enclosed by internal and external quartz cylinders of circular cross section, 13 and 14 respectively, which are largely transparent to light and heat. A controlled environment is provided between quartz cylinders 13 and 14 wherein the wafers are to be processed.

It should be noted that in all cases, all heating apparatuses, including central heat source 15 are arranged to provide substantially uniform heating of wafers 11. To this end, in a further alternative embodiment of the present invention, one or both of central heat source 15 and outer heating apparatus may be configured to have zones of different heating levels in order to compensate for variations in heating due to effects such as gravity or gas flow in the space between quartz cylinders 13 and 14 wherein the wafers are to be processed.

FIG. 1B is a simplified perspective view of the quartz enclosure and the arrangement of the wafers of the furnace of FIG. 1A. As in FIG. 1A, the hexagonal arrangement of six wafers, while preferred, is shown by way of example; the present invention may accommodate fewer or more wafers, as described above. In the present embodiment, there are two tiers of wafers, upper and lower, as shown in the drawing. In a preferred embodiment of the present invention, the furnace can process all the wafers of both levels simultaneously, thereby increasing wafer throughput without requiring additional clean room floor space. The present invention further includes furnaces configured to accommodate a single level of wafers or furnaces and support arrangements that can accommodate more than two tiers of wafers.

Figure 2A:
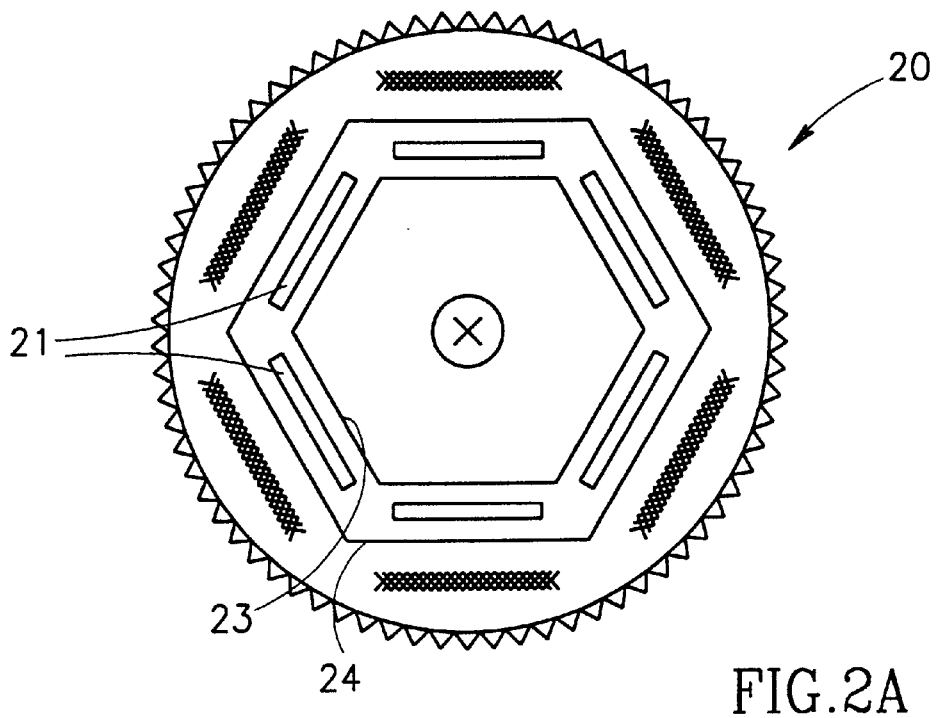
FIG. 2A is a schematic cutaway top view of a furnace for processing semiconductor wafers constructed and operative in accordance with a further preferred embodiment of the present invention.
Figure 2B:
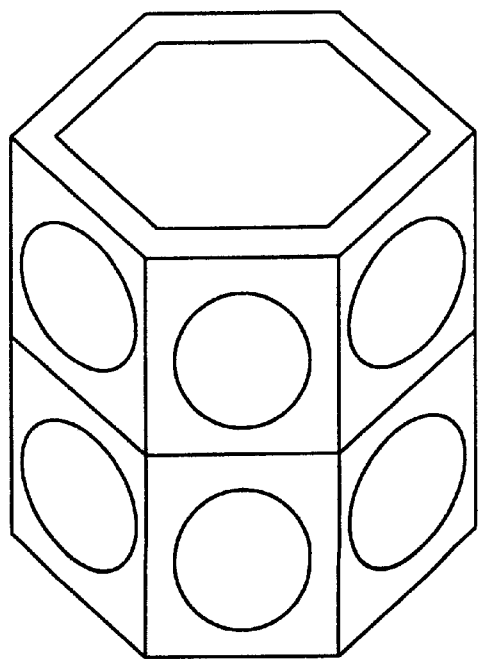
FIG. 2B a simplified perspective view of the quartz enclosure and the arrangement of the wafers of the furnace of FIG. 2A.

Referring now to FIGS. 2A and 2B, there is shown a simplified representation of a furnace for processing semiconductor wafers, referred to generally as 20, constructed and operative in accordance with a further preferred embodiment of the present invention. FIG. 2A is a schematic cutaway top view of furnace 20, similar to furnace 10 shown in FIG. 1A, which has the same functional components. Furnace 20 of the present embodiment differs from furnace 10 of the previous embodiment in that wafers 21 are enclosed by internal and external quartz enclosures of polygonal, in the present embodiment hexagonal, cross section, 23 and 24 respectively, forming a right polyhedron, with the same function and properties as those of circular cylinders 13 and 14 shown in FIG. 1A. FIG. 2B is a simplified perspective view of the polyhedronal quartz enclosure and the polyhedronal arrangement of the wafers of furnace 20 of FIG. 2A. As in FIGS. 1A and 1B, the hexahedronal arrangement of six wafers in two tiers, while preferred, is shown by way of example; the present invention may accommodate fewer or more wafers and tiers, as described above.

It will be appreciated by persons skilled in the art that suitable round tubes as shown FIGS. 1A and 1B are more readily fabricated than the polyhedronal enclosures of FIGS. 2A and 2B, while the generally parallel faces of the polyhedronal enclosures of FIGS. 2A and 2B allow for more uniform heating of the wafers therein. A further advantage of the polyhedronal embodiment of FIGS. 2A and 2B is the smaller volume of the controlled environment space containing wafers 21, especially for larger wafer diameters.

Figure 3:
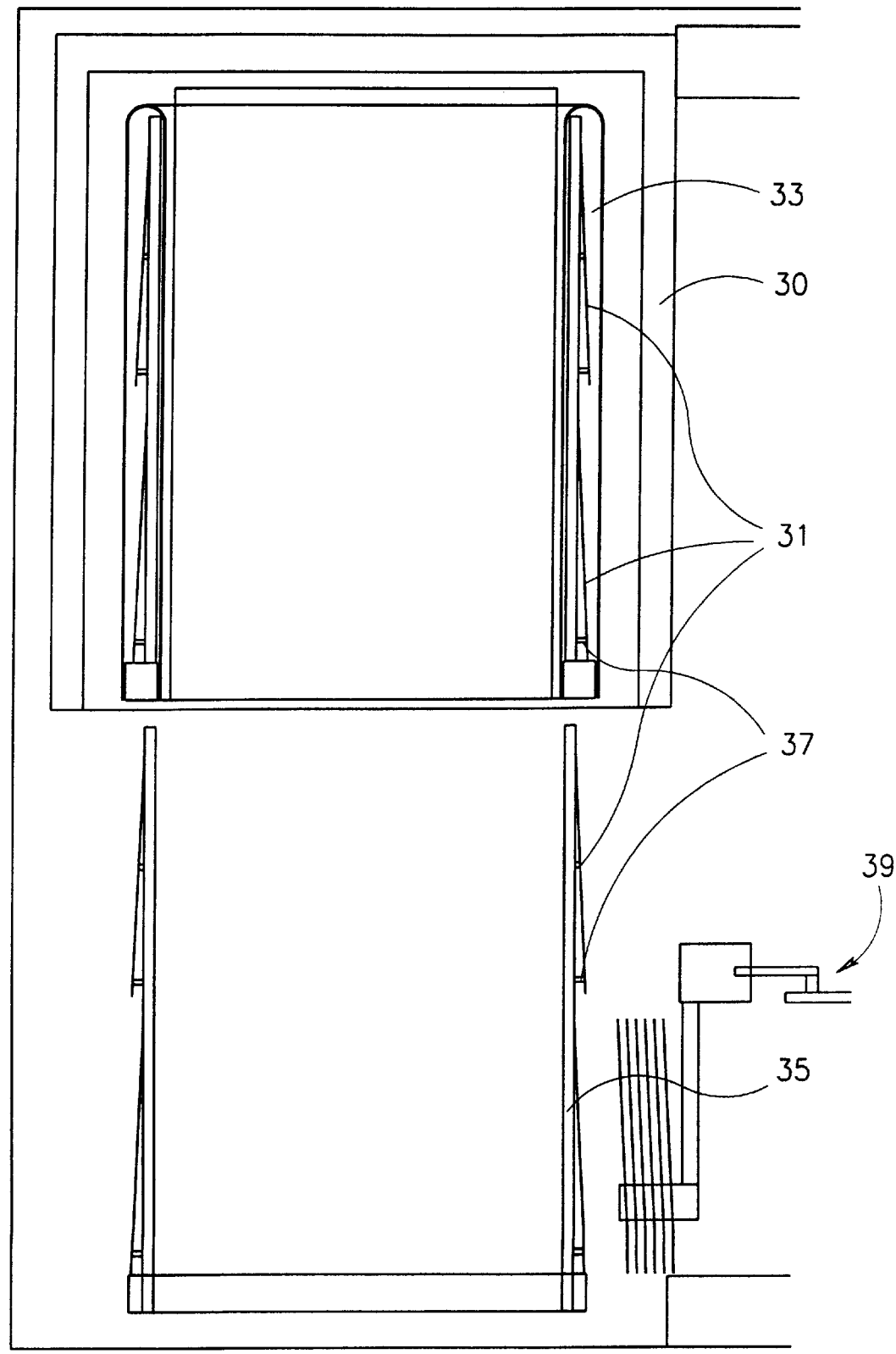
FIG. 3 is a schematic representation of the wafer handling and support arrangements of a furnace constructed and operative in accordance with a preferred embodiment of the present invention.

Referring now to FIG. 3, there is shown, in schematic representation, the wafer handling and support arrangements of a furnace constructed and operative in accordance with a preferred embodiment of the present invention. In the upper portion of the drawing, there is shown, a furnace 30 containing a fully loaded wafer enclosure 33. The lower portion shows a wafer support structure 35, wafers 31 are supported on structure 35 by quartz pins 37 at an angle within the range of 1° to 5°, though preferably at an angle of 3°, from the vertical, which, as will be understood by persons skilled in the art, is stable, reduces vibration, and forces all tolerances to one side. Wafer support structure 35 can be quickly loaded with wafers 31 by a wafer handling device, referred to generally as 39. Such devices are known in the semiconductor industry and could readily be accommodated to the present invention. Once loaded with wafers 31, wafer support structure 35 can be inserted into a quartz wafer enclosure 33 and then moved into furnace 30 for processing.

The present invention, in employing tungsten-halogen heating lamps, provides the known advantages of faster temperature ramp up and cool down, reduced thermal budget, and greater processing precision, associated with cold-wall processes in semiconductor wafer processing such as rapid thermal processing (RTP). By heating the wafers from both sides, additional temperature ramp up speed and temperature uniformity may be obtained. The wafer support arrangement of the present invention further allows multiple wafers to be processed simultaneously in a compact geometrical arrangement, thereby providing some of the known wafer throughput advantages of larger, more expensive, batch furnaces.

It will further be appreciated, by persons skilled in the art, that the scope of the present invention is not limited by what has been specifically shown and described hereinabove, merely by way of example. Rather, the scope of the present invention is defined solely by the claims, which follow.

What is claimed is:

1. A furnace for processing semiconductor wafers including:
    an insulating enclosure;
    first heating apparatus disposed centrally with respect to said insulating enclosure;
    a frame operative to support a multiplicity of semiconductor wafers in a nearly vertical orientation in at least one right polyhedronal tier about and facing said first centrally disposed heating apparatus;
    a double-walled quartz enclosure for enclosing the wafers which is operative to enable the wafers to be processed in a predetermined controlled environment; and
    second heating apparatus disposed between said quartz enclosure and said insulating enclosure arranged, together with said first heating apparatus, for substantially uniform heating of the wafers.

2. A furnace according to claim 1, wherein said second heating apparatus is divided into a multiplicity of zones of different predetermined heating levels.

3. A furnace according to claim 1, wherein said first heating apparatus is one of the set which consists of a tungsten-halogen heating lamp and an array of tungsten-halogen heating lamps.

4. A furnace according to claim 1, wherein said second heating apparatus is one of the set which consists of at least one array of tungsten-halogen heating lamps and at least one electrical heating device.

5. A furnace according to claim 1, wherein said frame includes quartz pegs to bear the wafers and wherein said frame and said pegs are operative to orient the wafers at an angle in the range of 1 to 5 degrees from the vertical.

6. A furnace according to claim 1, further including wafer handling apparatus operative to position wafers in said frame.

7. A method of processing semiconductor wafers in a furnace including the steps of:
    arranging semiconductor wafers with a nearly vertical orientation in at least one polyhedronal tier about the center of the furnace;
    heating the wafers from both sides simultaneously.

8. A method of processing semiconductor wafers according to claim 7, wherein said step of heating includes the step of heating different pluralities of semiconductor wafers to different predetermined temperatures.

9. A method according to claim 8, wherein said step of arranging includes the step of arranging different pluralities of semiconductor wafers in different predetermined vertical zones, and said step of heating different pluralities includes heating different pluralities of semiconductor wafers in different vertical zones to different predetermined temperatures.

* * * * *